United States Patent
Perner et al.

(10) Patent No.: US 6,456,525 B1
(45) Date of Patent: Sep. 24, 2002

(54) SHORT-TOLERANT RESISTIVE CROSS POINT ARRAY

(75) Inventors: Frederick A. Perner, Palo Alto; Thomas C. Anthony, Sunnyvale, both of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/663,752

(22) Filed: Sep. 15, 2000

(51) Int. Cl.⁷ .............................................. G11C 11/14
(52) U.S. Cl. ...................... 365/171; 365/100; 365/148; 365/158
(58) Field of Search ................................. 365/100, 148, 365/158, 171, 173

(56) References Cited

U.S. PATENT DOCUMENTS

| | | | |
|---|---|---|---|
| 3,761,896 A | | 9/1973 | Davidson |
| 4,396,998 A | * | 8/1983 | Hunt et al. .................. 365/148 |
| 5,365,476 A | * | 11/1994 | Mukhanov .................. 365/162 |
| 5,640,343 A | | 6/1997 | Gallagher et al. .......... 365/171 |
| 5,761,110 A | * | 6/1998 | Irrinki et al. ................ 365/100 |
| 5,764,567 A | * | 6/1998 | Parkin ........................ 365/173 |
| 5,883,827 A | | 3/1999 | Morgan ....................... 365/100 |
| 5,991,193 A | * | 11/1999 | Gallagher et al. .......... 365/171 |
| 6,130,835 A | * | 10/2000 | Scheuerlein ................ 365/171 |
| 6,191,972 B1 | * | 2/2001 | Miura et al. ................ 365/171 |

* cited by examiner

*Primary Examiner*—Son Mai

(57) ABSTRACT

A data storage device includes a resistive cross point array of memory cells. Each memory cell includes a memory element and a resistive element connected in series with the memory element. The resistive elements substantially attenuate any sneak path currents flowing through shorted memory elements during read operations. The data storage device may be a Magnetic Random Access Memory ("MRAM") device.

37 Claims, 8 Drawing Sheets

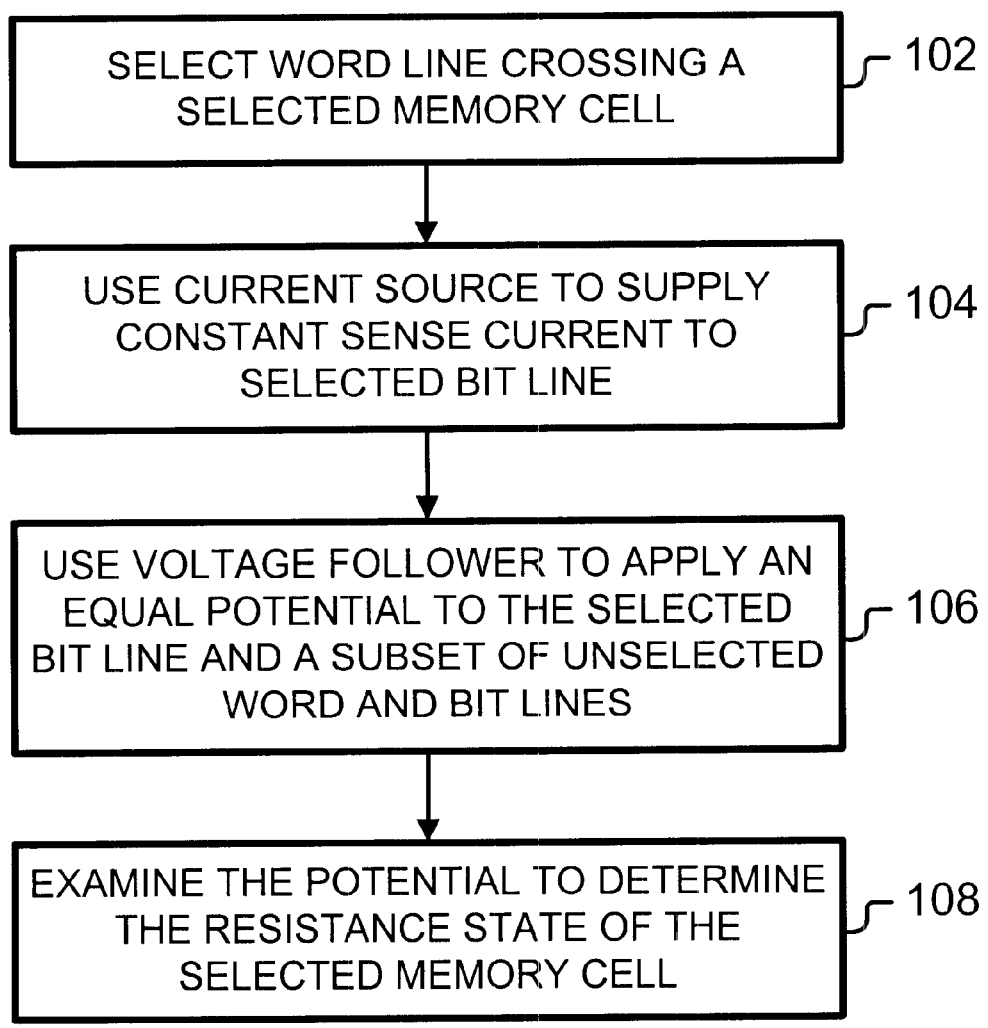

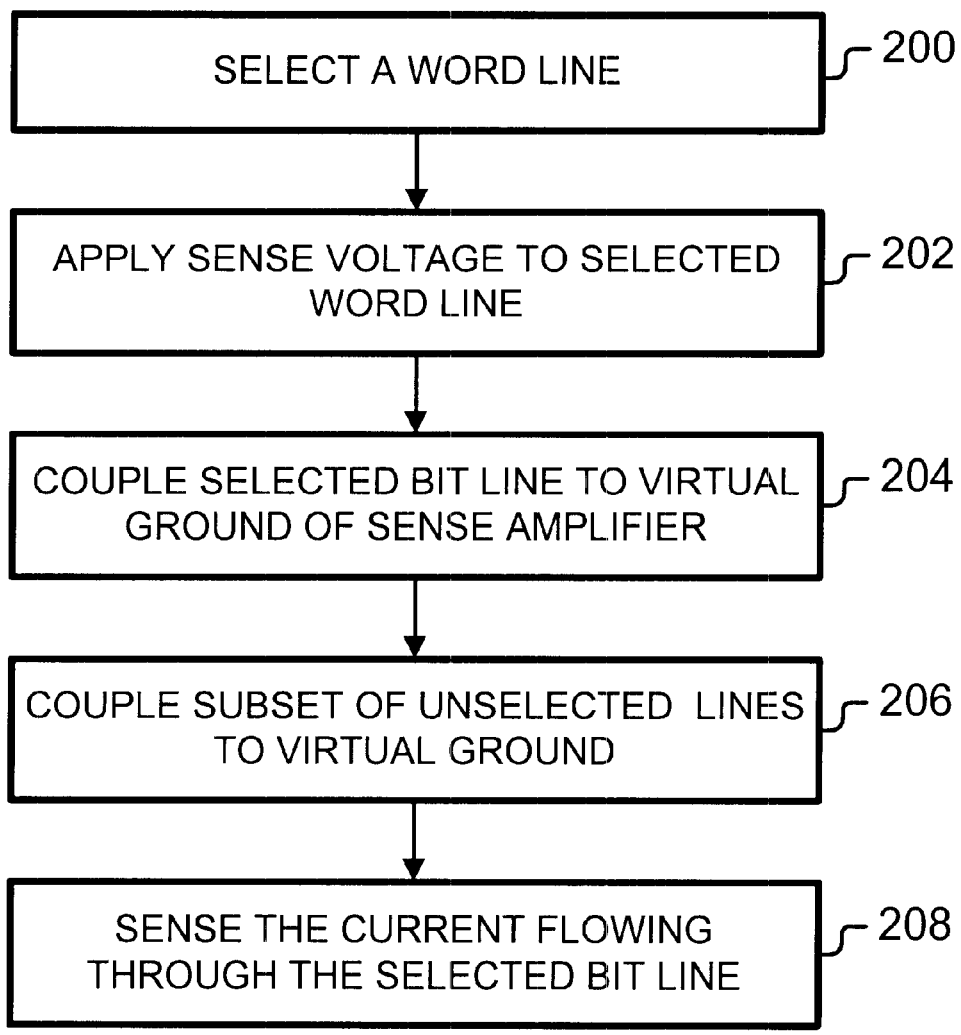

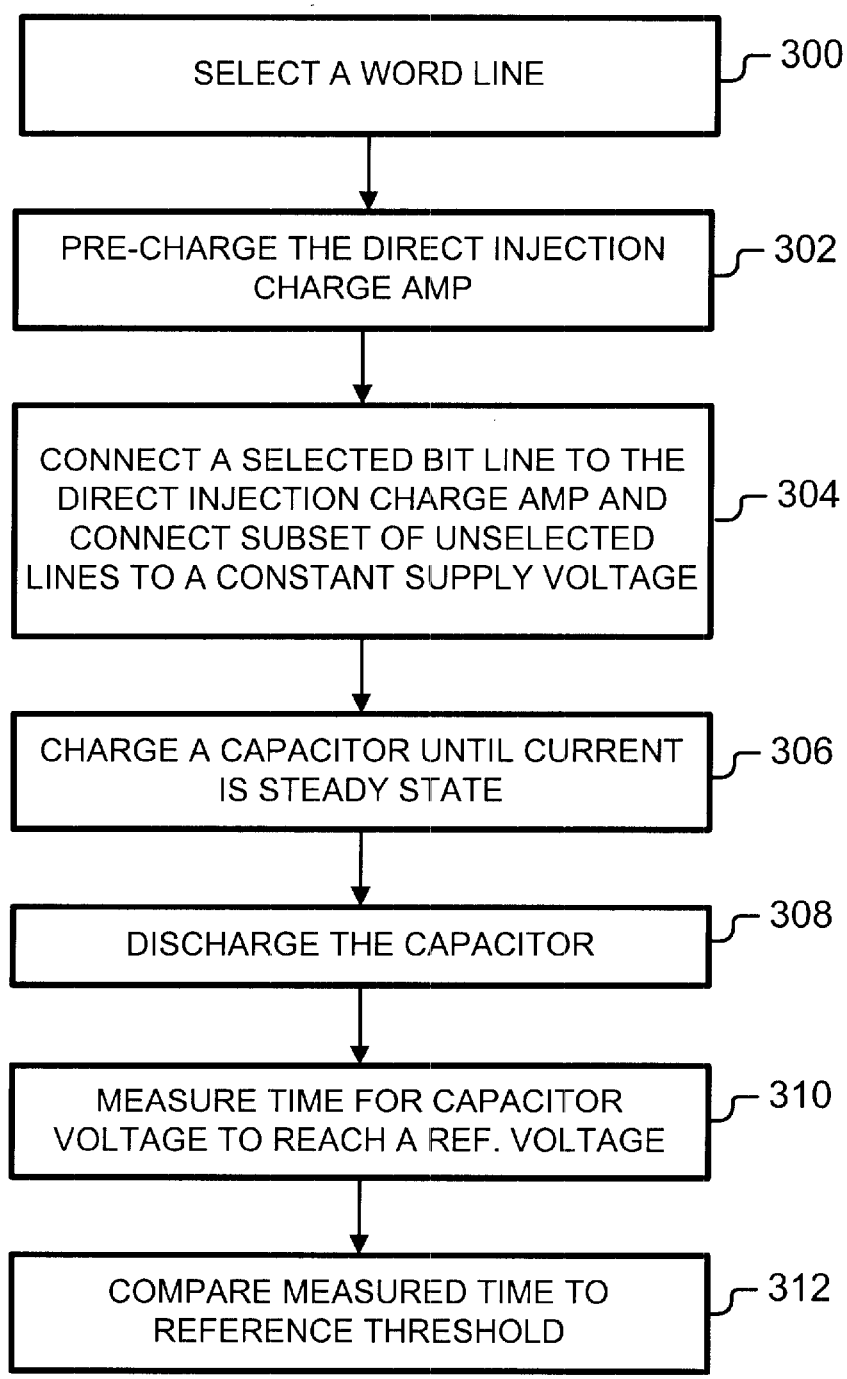

SHORT-TOLERANT RESISTIVE CROSS POINT ARRAY

BACKGROUND OF THE INVENTION

The present invention relates to data storage devices. More specifically, the present invention relates to a data storage device including a resistive cell cross point memory array.

Magnetic Random Access Memory ("MRAM") is a non-volatile memory that is being considered for data storage. A typical MRAM device includes an array of memory cells. Word lines extend along rows of the memory cells, and bit lines extend along columns of the memory cells. Each memory cell is located at a cross point of a word line and a bit line.

The memory cells may include spin dependent tunneling ("SDT") junction devices. The magnetization of a SDT junction device assumes one of two stable orientations at any given time. These two stable orientations, parallel and anti-parallel, represent logic values of '0' and '1.' The magnetization orientation, in turn, affects the resistance of the SDT junction device. Resistance of the SDT junction device is a first value R if the magnetization orientation is parallel and a second value R+ΔR if the magnetization orientation is anti-parallel.

The magnetization orientation of a SDT junction device and, therefore, its logic state may be read by sensing its resistance state. However, the memory cells in the array are coupled together through many parallel paths. The resistance seen at one cross point equals the resistance of the memory cell at that cross point in parallel with resistances of memory cells in the other rows and columns. In this regard, the array of memory cells may be characterized as a cross point resistor network.

An SDT junction device has a tunneling barrier that is only a few atoms thick. Controlling the fabrication process to produce such thin barriers for an entire array of memory cells is difficult. It is likely that some of the barriers will be thinner than designed or contain structural defects. If certain memory cells have tunneling barriers that are defective or thinner than designed, those memory cells might be shorted.

If one SDT junction device is shorted, the shorted SDT junction device will be unusable. In an array that does not use switches or diodes to isolate memory cells from one another, the other memory cells in the same column will also be rendered unusable. Thus, a single shorted SDT junction memory cell can cause a column-wide error.

Error code correction could be used to recover data from a complete column of unusable memory cells. However, correcting a thousand or more bits in a single column is costly, both from a time standpoint and a computational standpoint. Moreover, a typical storage device might have more than one column with a shorted SDT junction device.

Therefore, a need exists to overcome the problems associated with shorted SDT junction devices in resistive cell cross point memory arrays.

SUMMARY OF THE INVENTION

According to one aspect of the present invention, a memory cell of a resistive cell cross point memory array includes a memory element and a linear resistive element connected in series with the memory element. If the memory element becomes shorted, the shorted memory element will cause a randomized bit error. However, the shorted memory element will not cause a column-wide error.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 2b is a diagram of an electrical equivalent of a memory cell shown in FIG. 2a;

FIG. 4 is an illustration of a first method of reading a memory cell in the memory cell array;

FIG. 5 is an illustration of a second method of reading a memory cell in the memory cell array;

FIG. 6 is an illustration of a third method of reading a memory cell in the memory cell array;

DETAILED DESCRIPTION OF THE INVENTION

Figure 1:
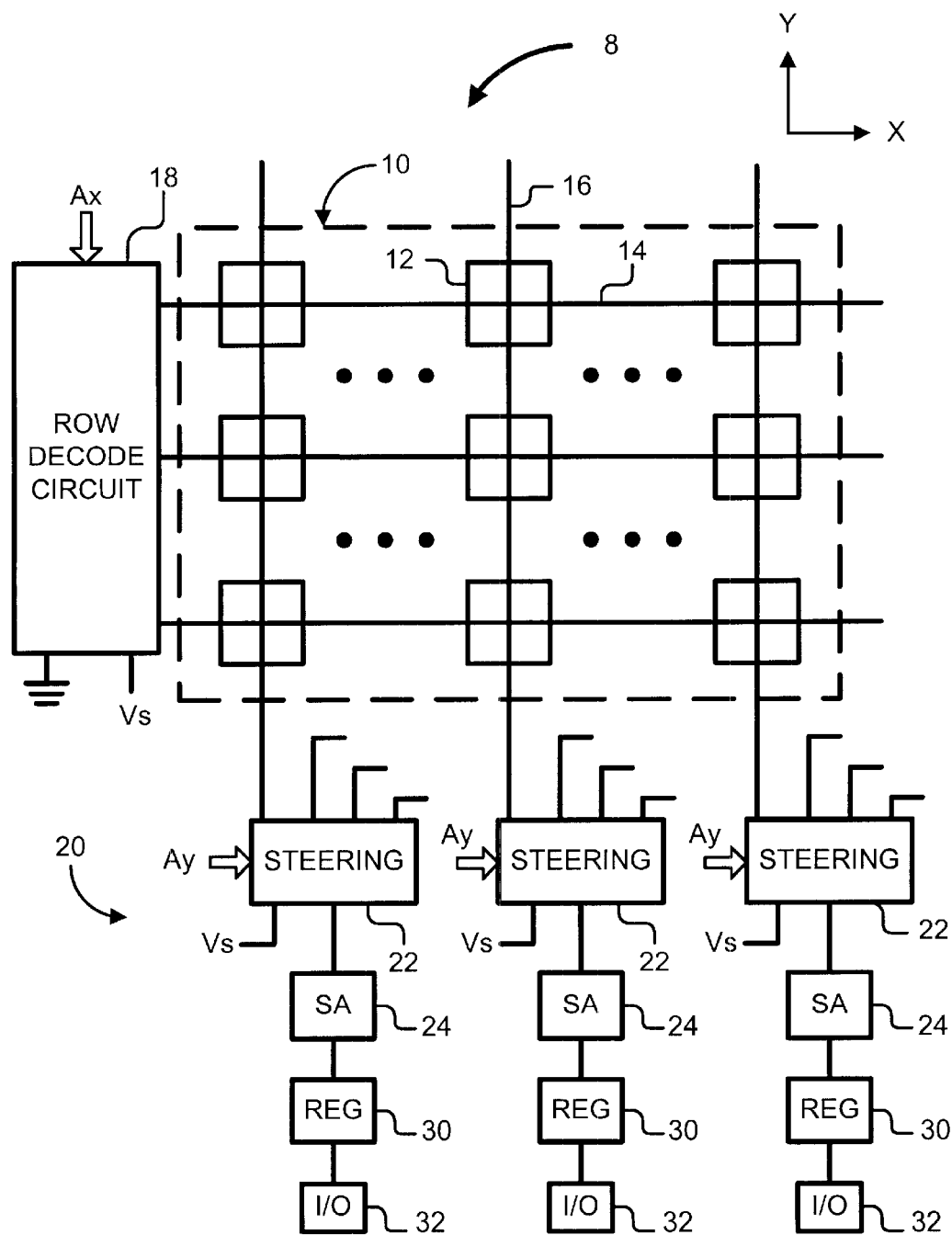
FIG. 1 is an illustration of an MRAM device including a memory cell array according to the present invention.

As shown in the drawings for purposes of illustration, the present invention is embodied in an MRAM device including a resistive cross point array of memory cells and circuitry for sensing resistance states of the memory cells. The device does not include switches or diodes for isolating memory cells from one another during read operations. Instead, the circuitry isolates a selected memory cell by applying an equal potential to selected and certain unselected word and bit lines. Applying the equal potential can prevent parasitic currents from interfering with the read operations. Each memory cell includes a linear resistive element connected in series with a memory element. If the memory element becomes shorted, the shorted memory element will cause a randomized bit error. However, the shorted memory element will not cause a column-wide error. The randomized bit failure can be corrected by ECC far more quickly and easily than a column-wide failure.

Reference is now made to FIG. 1, which illustrates an MRAM device 8 including an array 10 of memory cells 12. The memory cells 12 are arranged in rows and columns, with the rows extending along an x-direction and the columns extending along a y-direction. Only a relatively small number of memory cells 12 are shown to simplify the description of the invention. In practice, arrays of any size may be used.

Traces functioning as word lines 14 extend along the x-direction in a plane on one side of the memory cell array 10. Traces functioning as bit lines 16 extend along the y-direction in a plane on an opposite side of the memory cell array 10. There may be one word line 14 for each row of the array 10 and one bit line 16 for each column of the array 10.

Each memory cell 12 is located at a cross point of a corresponding word line 14 and bit line 16.

The MRAM device 8 also includes a row decode circuit 18. During read operations, the row decode circuit 18 may apply either a constant supply voltage (Vs) or a ground potential to the word lines 14. The constant supply voltage (Vs) may be provided by an external circuit.

The MRAM device 8 further includes a read circuit for sensing the resistance of selected memory cells 12 during read operations and a write circuit for orienting the magnetization of selected memory cells 12 during write operations. The read circuit is indicated generally at 20. The write circuit is not shown in order to simplify the explanation of the present invention.

The read circuit 20 includes a plurality of steering circuits 22 and sense amplifiers 24. Multiple bit lines 16 are connected to each steering circuit 22. Each steering circuit 22 includes a set of switches that may connect each bit line 16 to a source of operating potential or a sense amplifier 24. An output of the sense amplifier 24 is supplied to a data register 30, which, in turn, is coupled to an I/O pad 32 of the MRAM device 8.

Figure 2A:
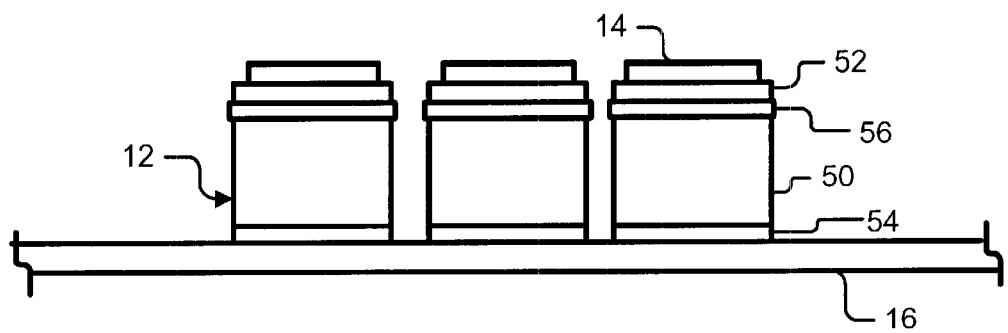
FIG. 2a is an illustration of memory cells for the MRAM device.

FIG. 2a shows several memory cells 12 of a column of the array 10. Each memory cell 12 includes an MRAM element 50 that stores a bit of information as an orientation of a magnetization. The magnetization of the memory element 50 may assume one of two stable orientations at any given time. These two stable orientations, parallel and anti-parallel, represent logic values of '0' and '1.'

The magnetization orientation affects the resistance. Resistance of a memory element 50 is a first value (R) if the magnetization orientation is parallel, and the resistance of the memory element 50 is increased to a second value (R+ΔR) if the magnetization orientation is changed from parallel to anti-parallel.

The memory elements 50 are not limited to any particular type. For example the memory elements 50 may be SDT junction devices.

Each memory cell 12 further includes a first ohmic contact 52 between its memory element 50 and a word line 14, and a second ohmic contact 54 between its memory element 50 and a bit line 16. The word and bit lines 14 and 16 are typically low resistance conductors made of a metal such as aluminum or copper. The ohmic contacts 52 and 54 provide an interface between the metal lines 14 and 16 and magnetic layers of the memory element 50. Although the first and second ohmic contacts 52 and 54 are shown as separate elements 52 and 54, it is understood that these separate elements 52 and 54 may be eliminated and the metal lines 14 may make direct contact with the memory element 50.

Each memory cell 12 also includes a linear resistive element 56 between the memory device 50 and one of the metal lines 14 or 16. FIG. 2a happens to show the resistive element 56 between the word line 14 and the memory element 50. However, the resistive element 56 may instead be between the bit line 16 and the memory element 50.

The resistive elements 56 are not limited to any particular class of materials. A resistive element 56 may be made of a semiconductor material (e.g., carbon, silicon, germanium, indium telluride, antimony telluride), a semiconductor-metal alloy (e.g., silicon-tantalum), a dielectric (e.g., aluminum oxide, tantalum oxide, magnesium oxide, silicon oxide, silicon nitride, aluminum nitride), a dielectric-metal composite (e.g., aluminum oxide-gold), or a polymer. The resistive material should be compatible with the manufacturing process and meet resistance requirements.

For the sub-micron dimensions anticipated for fabrication of a memory cell, the resistivity ($\rho$) of the series-connected resistive element 56 will generally be in the range of 0.1 to 1,000 ohms-cm. The resistance (R) will depend upon the thickness (t) and planar area (A) of the resistive element 56 according to the equation $R=(\rho t)/A$. This resistivity range is orders of magnitude larger than measured in metals, but lies within the range of resistivities provided by semiconductors, alloys of metals and semiconductors, and composite dielectric-metal systems. As an example, a resistive element 56 having a planar area of $A=0.1$ $\mu m^2$ formed from a film having a thickness $t=50$ nm and a resistivity of $\rho=20$ ohms-cm would have a resistance of 100 Kohms.

If the resistive element 56 is a dielectric (e.g., insulating) film, then the resistance is governed by electron tunneling instead of the equation $R=\rho tA$. For dielectric films, the tunneling resistance is a strong function of film thickness. Dielectric films within the thickness range 0.5 to 10 nm are applicable for the resistive elements. A special case of a dielectric film as the resistive element 56 is for the dielectric film to be within an SDT memory element. Thus, the resistive element may be formed from an SDT memory element.

The resistive elements 56 may be integrated with the memory element in several different ways. A first approach involves forming the resistive element 56 with the same planar area as the memory element 50. The simplest implementation of this approach would be to define the planar area of the resistive element 56 using the same patterning procedure used to define the memory element 50.

Such a resistive element 56 satisfies certain geometric constraints imposed by the size of the memory element 50. In particular, effective planar area of the resistive element 56 is roughly equal to the area of the memory element 50. Thickness of the resistive element is generally limited by the processing capabilities for patterning high aspect ratio (thickness divided by planar dimension) features.

Figure 2B:
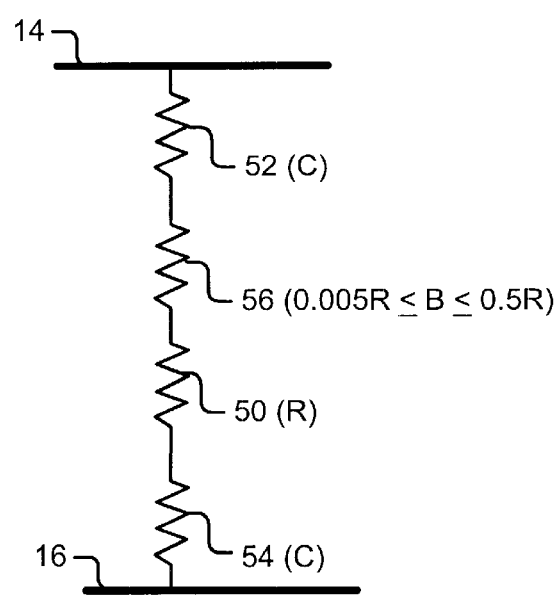

Referring additionally to FIG. 2b, resistance (B) of the resistive element 56 may be between about 0.5% and 50% of design (i.e., intended) nominal resistance (R) of the memory element 50 (that is, $0.005R \leq B \leq 0.5R$). A narrower range would be between about 10% and 50% of nominal resistance (R) of the memory element 50 (that is, $0.1R \leq B \leq 0.5R$). For example, the memory element 50 has a design nominal resistance (R) of one million ohms and a delta resistance (ΔR) of 200,000 ohms. Using the narrower range, the resistive element 56 has a resistance (B) between 100,000 ohms and 500,000 ohms. Using the wider range, the resistive element 56 has a resistance (B) between 5,000 ohms and 500,000 ohms. In contrast, the ohmic contacts 52 and 54 each have a resistance (C) of about ten ohms.

If a memory element 50 is shorted, the resistance of the memory cell 12 will be about equal to the resistance (B) of the resistive element 56. The advantage of the resistive element 56 during a read operation will now be illustrated in connection with FIGS. 3a and 3b.

Figure 3A:
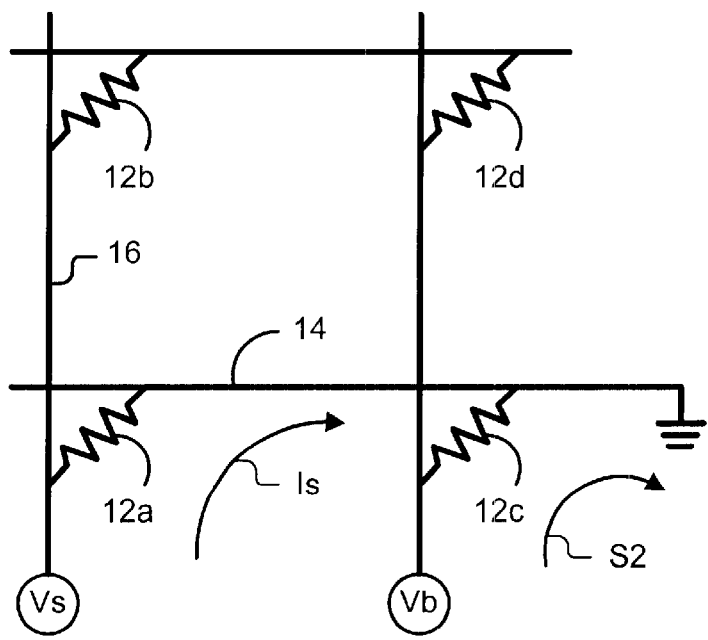
FIGS. 3a and 3b are illustrations of currents flowing through an electrical equivalent of the memory cell array during a read operation on a selected memory cell.

FIG. 3a shows an electrical equivalent of the memory cell array 10 during a read operation. A selected memory cell is represented by a first resistor 12a, and unselected memory cells are represented by second, third and fourth resistors 12b, 12c and 12d. The second resistor 12b represents the half-selected memory cells along the selected bit line, the third resistor 12c represents the half-selected memory cells along the selected word line, and the fourth resistor 12d represents the remaining unselected memory cells. If, for example, all of the memory cells 12 have a resistance of about R+B and if the array 10 has n rows and m columns, then the second resistor 12b will have a resistance of about (R+B)/(n−1), the third resistor 12c will have a resistance of about (R+B)/(m−1), and the fourth resistor 12d will have a resistance of about (R+B)/[(n−1)(m−1)].

The first resistor 12a may be selected by applying an operating potential (Vs) to the crossing bit line and a ground potential to the crossing word line. Consequently, a sense current ($I_s$) flows through the first resistor 12a.

To prevent sneak path currents from obscuring the sense current ($I_s$), an equal operating potential (Vb=Vs) is applied to the unselected bit line. Applying this equal potential (Vb) to the unselected bit line blocks the sneak path currents from flowing through the second and fourth resistors 12b and 12d and diverts to ground a sneak path current (S2) flowing through the third resistor 12c.

Figure 3B:
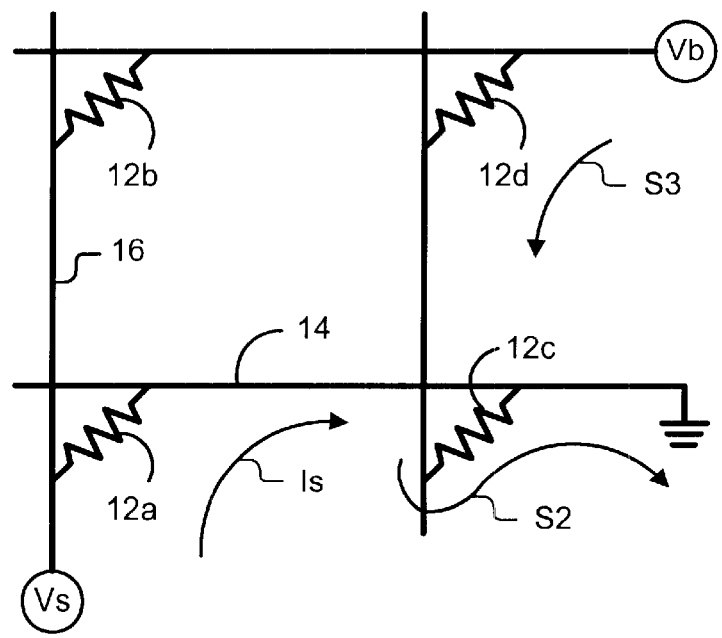

The same operating potential (Vb=Vs) may be applied to the unselected word line instead of the unselected bit line, as shown in FIG. 3b. Applying this equal potential (Vb) to the unselected word line blocks the sneak path current from flowing through the second resistor 12b and diverts to ground the sneak path currents (S2 and S3) flowing through the third and fourth resistors 12c and 12d.

Ideal sense amplifiers 24 apply an equal potential to the selected bit line and the subset of unselected word and bit lines. If, however, the sense amplifiers 24 are not ideal, the potentials are not exactly equal and sneak path currents flow though the array 10 during read operations.

Consider a read operation on a selected memory cell 12 lying in the same column as a memory cell 12 having a shorted memory element 50. The half-selected memory cell 12 still has a resistance at least equal to the resistance (B) of its resistive element 56. Even if the sense amplifiers 24 are not ideal, the half-selected memory cell 12 with the shorted memory element 50 does not divert a significant amount of sneak path current through the shorted memory element 50 and does not significantly affect the sense current during read operations. As a result, the half-selected memory cell 12 does not cause a column-wide failure. Only a single randomized bit error results. The single randomized bit error can be corrected quickly and easily by error code correction.

Now compare the read operation just described with a read operation involving conventional memory cells and non-ideal sense amplifiers. A conventional half-selected memory cell having a shorted memory element would draw a significant sneak path current that, when combined with the sense current, would cause the sense amplifier to cut-off or saturate. As a result, a bit error would occur during a read operation on the selected memory cell. Moreover, the shorted memory element of the conventional half-selected memory cell would divert the sense current during read operations in every other memory cell of the column. A column-wide error would result.

FIGS. 4, 5 and 6 illustrate three methods of applying the equal potential to the memory cell array 10 and sensing the resistance state of the selected memory cells 12. These methods and corresponding hardware implementations are disclosed in assignee's U.S. Ser. No. 09/564308 filed Mar. 3, 2000 and issued as U.S. Pat. No. 6,259,644.

Reference is now made to FIG. 4, which illustrates a method of using a current source, voltage follower and comparator to determine the resistance state of a selected memory cell. The row decode circuit selects a word line crossing the selected memory cell (block 102) by connecting the selected word line to the ground potential. The current source supplies a sense current to a bit line crossing the selected memory cell (block 104). A potential at a junction between the current source and the selected memory cell is detected by the voltage follower, which applies the same potential to a subset of unselected lines such as the unselected bit lines or the unselected word lines (106). The potential at the junction is also compared to a reference voltage by the comparator. An output of the comparator provides a high or low signal that indicates the resistance state of the selected memory cell (block 108).

Reference is now made to FIG. 5, which illustrates a method of using a current sense amplifier and a voltage source to detect the resistance state of a selected memory cell. A word line is selected (block 200) and the row decode circuit applies a sense voltage Vs to the selected word line (block 202), and the selected bit line is coupled to a virtual ground of the current sense amplifier (block 204). The sense voltage Vs may be a dc voltage between 0.1 volts and 0.5 volts and may be provided by an external source. A subset of unselected lines (e.g., all unselected bit lines) is also connected to a potential that is equal to the virtual ground (block 206). The virtual ground may be a zero potential or any other potential, so long as an equal potential is applied to the selected bit line and the subset of unselected lines.

A sense current flows from the voltage source, through the selected memory cell, and through the current sense amplifier. Because the subset of unselected lines is also connected to a potential equal to the virtual ground, any sneak path currents flowing through the unselected lines will be small in comparison to the sense current and will not interfere with the sense current.

The sense current flowing through the selected bit line may be sensed to determine the resistance state and, therefore, logic value of the selected memory cell (block 208). The sense current is equal to either Vs/R or Vs/(R+ΔR), depending upon the resistance state of the selected memory cell.

Reference is now made to FIG. 6, which illustrates a method of using a direct injection charge amplifier to apply an equal potential to the array 10 during a read operation on a selected memory cell 12. At the beginning of a read operation, a word line is selected (block 300), the direct injection charge amplifier is pre-charged to a voltage $V_{DD}$ (block 302), and the selected bit line is connected to the direct injection charge amplifier and a subset of unselected lines is connected to a constant supply voltage Vs (block 304). Consequently, a sense current flows through the selected memory cell and charges a capacitor. After the sense current has reached a steady state condition (block 306), the capacitor is used to supply the sense current to the selected bit line (block 308). This causes a depletion of the charge stored in the capacitor and causes the capacitor voltage to decay. As the sense current is integrated, capacitor voltage is decreased. The time for the capacitor voltage to reach a reference voltage is measured (block 310), and the measured time is compared to a threshold (block 312). The comparison indicates the resistance state and, therefore, logic value of the selected memory cell.

Figure 7:
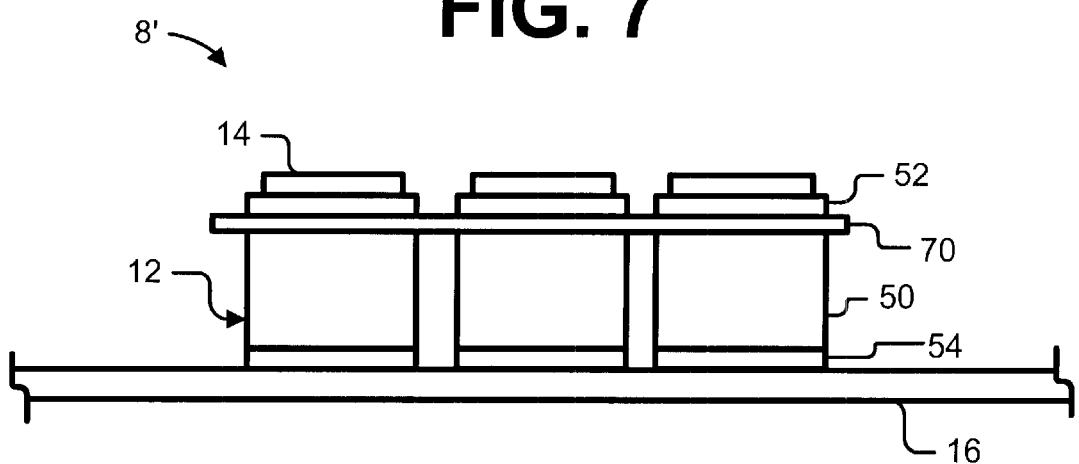
FIG. 7 is an illustration of alternative memory cells for the device of FIG. 1.

Reference is now made to FIG. 7, which illustrates second and third (alternative) approaches for integrating memory elements 50 with resistive elements 70 for the MRAM device 8'. Instead of patterning a plurality of resistive elements, the second approach involves forming a blanket resistor layer 70 between one or both ohmic contacts 52 and 54 and the memory element 50. The blanket layer 70 is unpatterned; therefore, it bridges the memory elements 50. Such a resistive element 70 is easier to fabricate because patterning is not involved. Although the first and second ohmic contacts 52 and 54 are shown as separate elements 52 and 54, it is understood that these separate elements 52 and 54 may be eliminated and the metal lines 14 may make direct contact with the memory element 50 or blanket layer 70.

Added resistance for each memory cell 12 is determined by the planar area of the memory element 50 and the thickness of the blanket layer over the memory element 50. The sheet resistance of the blanket layer 70 should be sufficiently large so as not to short adjacent conductors. An example of the blanket layer 70 is a very thin (e.g., a thickness of less than 10 nm) insulating film. In this case the in-plane resistance is essentially infinite, but the conductivity perpendicular to the plane is finite and occurs by tunneling.

The third approach involves defining the resistive element 56 in only one of the two planar dimensions such that the resistive element 56 has the same planar area as the word or bit line 14 or 16. The most convenient implementation of this approach would be to pattern the resistive material in the same process used to define the word or bit lines 14 or 16.

Figure 8:
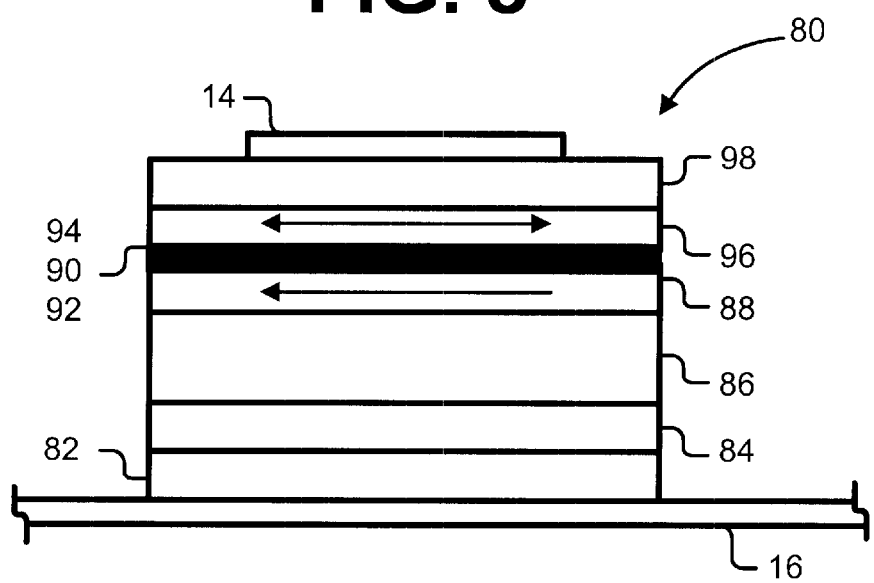
FIG. 8 is an illustration of an alternative memory cell for the device of FIG. 1.

Reference is now made to FIG. 8, which illustrates an alternative memory cell 80 for the MRAM device 8. This alternative memory cell is shown in conjunction with an SDT junction. Such a memory cell 80 includes a multi-layer stack of materials. The stack includes first and second seed layers 82 and 84. The first seed layer 82 allows the second layer 84 to be grown with a (111) crystal structure orientation. The second seed layer 84 establishes a (111) crystal structure orientation for a subsequent antiferromagnetic ("AF") pinning layer 86. The AF pinning layer 86 provides a large exchange field, which holds the magnetization of a subsequent pinned (bottom) ferromagnetic ("FM") layer 88 in one direction. Atop the pinned FM layer 88 is an insulating tunnel barrier 90. Optional interfacial layers 92 and 94 may sandwich the insulating tunnel barrier 90. Atop the insulating tunnel barrier 90 is a sense (top) FM layer 96 having a magnetization that is free to rotate in the presence of an applied magnetic field. An ohmic contact 98 is atop the sense FM layer 96, and the word line 14 makes electrical contact with the ohmic contact 98. A protective dielectric (not shown) covers the stack.

The pinned layer 88 has a magnetization that is oriented in a plane, but fixed so as not to rotate in the presence of an applied magnetic field in a range of interest. The sense layer 96 has a magnetization orientation that is not pinned. Rather, the magnetization can be oriented in either of two directions along an axis (the "easy" axis) lying in a plane. If the magnetization of the pinned and sense layers 88 and 96 are in the same direction, the orientation is parallel. If the magnetization of the pinned and sense layers 88 and 96 are in opposite directions, the orientation is anti-parallel.

The insulating tunnel barrier 90 allows quantum mechanical tunneling to occur between the pinned and sense layers 88 and 96. This tunneling phenomenon is electron spin dependent, making the resistance of the SDT junction a function of the relative orientations of the magnetization of the free and pinned layers. The insulating tunnel barrier 90 may be a layer of aluminum oxide ($Al_2O_3$) having a thickness of about 15 angstroms.

This alternative memory cell 80 does not include a resistive element made of a separate layer of resistive material. Instead, the resistive element and the ohmic contact 98 are integrated into a unitary structure by making the ohmic contact 98 of a high-resistivity material. Thus, the ohmic contact 98 has a resistance (B) that is between 0.5% and 50% of the design nominal resistance of the SDT junction.

The resistive element may instead be integrated with the first seed layer 82 or the second seed layer 84 by making the first or second seed layer 82 or 84 of a high-resistivity material.

Thus disclosed is an MRAM device that does not include switches and diodes for isolating memory cells from one another during read operations. Instead, the device isolates a selected memory cell by applying an equal potential to selected and certain unselected word and bit lines. Applying the equal potential can prevent parasitic currents from interfering with the read operations. Moreover, the resistive elements connected in series with the memory cells avoid problems caused by shorted memory cells. If a memory cell becomes shorted, the shorted memory cell will cause a randomized bit error. However, the shorted memory cell will not cause a column-wide failure. The randomized bit failure can be corrected by ECC far more quickly and easily than a column-wide failure.

The resistive elements also help to isolate causes of column-wide failures. If a column-wide failure occurs, it will be attributed to something other than a shorted memory cell.

The resistive elements also increase the reliability of write operations on selected memory cells. Without the resistive elements, large write currents would flow through shorted memory elements. Moreover, the write currents would be diverted from the selected memory cell to the shorted memory element, thereby reducing write currents and causing incorrect data to be written to the selected memory cells in the same row or column. However, a resistive element connected in series with that shorted memory element has a high enough resistance to prevent large write currents from flowing through the shorted memory element and allowing sufficient write current to flow through the selected memory cells.

Figure 9:
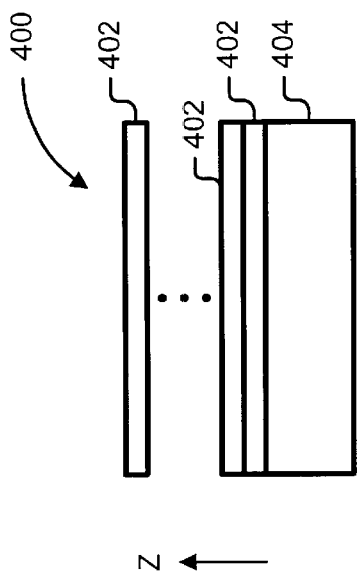
FIG. 9 is an illustration of an MRAM chip including multiple levels.

The MRAM device 8 is not limited to a single level of memory cells. Reference is now made to FIG. 9, which illustrates a multi-level MRAM chip 400. The MRAM chip 400 includes a number Z of memory cell levels or planes 402 that are stacked in a z-direction on a substrate 404. The number Z is a positive integer where $Z \geq 1$. The memory cell levels 402 may be separated by insulating material (not shown) such as silicon dioxide. Read and write circuits may be fabricated on the substrate 404. The read and write circuits may include additional multiplexers for selecting the levels that are read from and written to.

Figure 10:
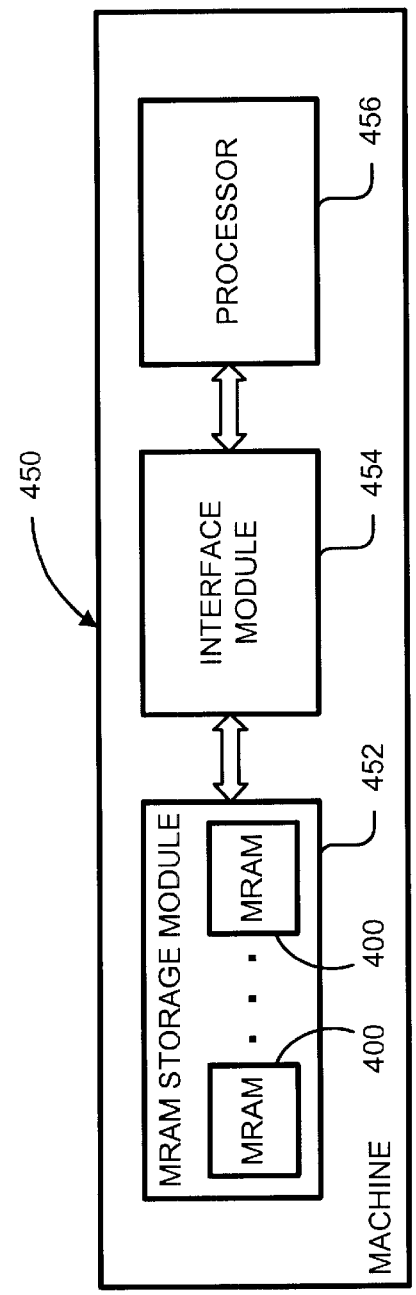
FIG. 10 is an illustration of a machine including one or more MRAM chips.

The MRAM device according to the present invention may be used in a variety of applications. FIG. 10 shows an exemplary general application for one or more MRAM chips 400. The general application is embodied by a machine 450 including an MRAM storage module 452, an interface module 454 and a processor 456. The MRAM storage module 452 includes one or more MRAM chips 400 for long term storage. The interface module 454 provides an interface between the processor 456 and the MRAM storage module 452. The machine 450 could also include fast volatile memory (e.g., SRAM) for short term storage.

For a machine 450 such as a notebook computer or personal computer, the MRAM storage module 452 might include a number of MRAM chips 400 and the interface module 454 might include an EIDE or SCSI interface. For a machine 450 such as a server, the MRAM storage module 452 might include a greater number of MRAM chips 400, and the interface module 454 might include a fiber channel or SCSI interface. Such MRAM storage modules 452 could replace or supplement conventional long term storage devices such as hard drives.

For a machine 450 such as a digital camera, the MRAM storage module 452 might include a smaller number of MRAM chips 400 and the interface module 454 might include a camera interface. Such an MRAM storage module 452 would allow long-term storage of digital images on-board the digital camera.

The MRAM device according to the present invention offers many advantages over hard drives and other conventional long-term data storage devices. Accessing data from the MRAM devices is orders of magnitude faster than accessing data from conventional long-term storage devices such as hard drives. Additionally, MRAM devices are more compact than hard drives.

The device is not limited to the specific embodiments described and illustrated above. For instance, the MRAM device has been described in connection with the rows being oriented along the easy axis. However, the rows and columns could be transposed.

The resistive cross point array is not limited to an array of MRAM cells. Memory elements of the memory cells may be of a phase-change material. Resistance of such elements may be changed from one state to another by a phase alteration of the phase change material (e. g., from a crystalline state to an amorphous state).

Instead, the memory cells may include polymer memory elements. Polymer memory elements are made of polar conductive polymer molecules. In a polymer memory element, data is stored as a 'permanent polarization' in a polymer molecule (in contrast to an MRAM memory cell, where data is stored as a 'permanent magnetic moment'). Resistance of a polymer memory element (whether R or R+ΔR) is dependant upon the orientation of polarization of the polymer molecules. Polymer memory cells elements may be read by sensing their resistance. Polymer memory cells may be written by applying electric fields generated by voltages applied to selected word and bit lines. If a polymer memory element becomes shorted, then the series-connected resistive element will isolate the shorted element.

The array is not even limited to memory cells. For example, a device may include an array of elements such as stress transducers. A sensing element could be built from a wide variety of materials that demonstrate a stress dependent resistance. A force or energy applied to a sensor element causes a change in conduction through the element. If the sensing element becomes shorted, then the series-connected resistive element will isolate the shorted sensing element. An advantage of applying the equipotential sensing method to a cross point array of stress transducers is a very high integration density.

In general, the resistance of the series-connected resistive element should be low enough to have a minimal effect on read operations and high enough to have minimal effect on write operations. Thus, the actual resistance should isolate the shorted memory element without degrading the sensing of selected memory cells and without degrading the sense signal during read operations and without degrading properties of writing to memory cells in the resistive cross point array. The resistance range of between 10% and 50% of the design nominal is believed to be ideal.

The maximum thickness of the resistive element is set by the affect on the induced electric and magnetic fields coupling to the selected memory cell and cross-talk to neighboring memory cells. For resistive cross point memory applications, a restriction may be placed on the thickness of the series-connected resistive element to avoid reducing the write field generated by voltages or currents flowing in the word or bit lines. The series-connected resistive element moves the memory element away from the surface of the line by a distance (d) equal to the thickness of the resistive element. In a current mode resistive cross point memory element, the magnetic field can drop off as 1/d. For this current mode memory element, the thickness of the series-connected resistive element should be less than about half the thickness of the conductor.

The present invention is not limited to the specific embodiments described and illustrated above. Instead, the invention is construed according to the claims that follow.

What is claimed is:

1. A data storage device comprising a resistive cross point array of memory cells, each memory cell including a memory element; and a linear resistive element connected in series with the memory element.

2. The device of claim 1, wherein the resistive element is a resistive film on the memory element.

3. The device of claim 2, wherein the resistive film is patterned.

4. The device of claim 2, wherein the resistive film bridges multiple memory elements.

5. The device of claim 1, wherein the resistive element includes another memory element.

6. The device of claim 1, wherein the resistive element is made of a semiconductor material.

7. The device of claim 1, wherein the resistive element is made of at least one of an oxide and nitride.

8. The device of claim 1, wherein the resistive element is made of an alloy of at least one of a metal and semiconductor.

9. The device of claim 1, wherein the resistive element is made of a conductive polymer.

10. The device of claim 1, wherein the resistive element also provides an ohmic contact with the memory element.

11. The device of claim 1, wherein each memory element includes a spin dependent tunneling junction device.

12. The device of claim 1, wherein the resistive elements have a resistance between about 10% and 50% of design resistance of the memory elements.

13. The device of claim 1, further comprising a plurality of word lines and bit lines for the array, wherein each memory element and series-connected resistive element are sandwiched between a crossing word and bit line.

14. The device of claim 1, further comprising:
a plurality of word lines and bit lines for the array; and
a circuit for sensing resistance states of selected memory cells during read operations on the selected memory cells, the circuit applying a first potential to selected bit lines, a second potential to selected word lines and a third potential to subsets of unselected word and unselected bit lines, the third potential being equal to the first potential.

15. An MRAM cell comprising:
a memory element having a design nominal resistance; and
a resistive element in direct contact with the memory element, the resistive element having a resistance of about 0.5% to 50% of the design resistance of the memory element.

16. The cell of claim 15, wherein the resistive element is a resistive film on the memory element.

17. The cell of claim 15, wherein the resistive element includes another memory element.

18. The cell of claim 15, wherein the resistive element is made of a semiconductor material.

19. The cell of claim 15, wherein the resistive element is made of at least one of an oxide and nitride.

20. The cell of claim 15, wherein the resistive element is made of an alloy of at least one of a metal and semiconductor.

21. The cell of claim 15, wherein the resistive element is made of a conductive polymer.

22. The cell of claim 15, wherein the resistive element also provides an ohmic contact with the memory element.

23. The cell of claim 15, wherein each memory element includes a spin dependent tunneling junction device.

24. The cell of claim 15, wherein the resistive element has a resistance of about 10% to 50% of the design resistance of the memory element.

25. A memory cell comprising:
   a memory element having a design nominal resistance; and
   a linear resistive element connected in series with the memory element.

26. A device comprising:
   a cross point array of first resistive elements having a design nominal resistance; and
   at least one second resistive element, each second resistive element being connected in series with a first resistive element, each second resistive element having a resistance between about 0.5% and 50% of the design resistance.

27. The memory cell of claim 25, wherein the memory element includes a thin film device.

28. The memory cell of claim 25, wherein the memory element includes a spin dependent tunneling junction device.

29. The memory cell of claim 28, wherein the resistive element is made of a conductive polymer.

30. The memory cell of claim 28, wherein the resistive element also provides an ohmic contact with the memory element.

31. The memory cell of claim 28, wherein the resistive element includes a resistive film on the memory element.

32. The memory cell of claim 28, wherein the resistive element includes another memory element.

33. The memory cell of claim 28, wherein the resistive element is made of a semiconductor material.

34. The memory cell of claim 28, wherein the resistive element is made of at least one of an oxide and nitride.

35. The memory cell of claim 28, wherein the resistive element is made of an alloy of at least one of a metal and semiconductor.

36. The memory cell of claim 28, wherein the spin dependent tunneling junction device includes a seed layer; and wherein the resistive element is integrated with the seed layer.

37. The memory cell of claim 25, wherein the resistive element has a resistance between about 10% and 50% of design resistance of the memory element.

* * * * *